United States Patent
Barrenscheen et al.

(10) Patent No.: US 12,494,779 B2
(45) Date of Patent: Dec. 9, 2025

(54) INTER-DRIVER CONTROL SIGNAL

(71) Applicant: Infineon Technologies AG, Neubiberg (DE)

(72) Inventors: Jens Barrenscheen, Munich (DE); Michael Krug, Munich (DE)

(73) Assignee: Infineon Technologies AG, Neubiberg (DE)

( * ) Notice: Subject to any disclaimer, the term of this patent is extended or adjusted under 35 U.S.C. 154(b) by 254 days.

(21) Appl. No.: 18/296,261

(22) Filed: Apr. 5, 2023

(65) Prior Publication Data

US 2023/0327665 A1    Oct. 12, 2023

Related U.S. Application Data

(60) Provisional application No. 63/362,852, filed on Apr. 12, 2022.

(51) Int. Cl.
*H03K 17/687* (2006.01)
*H03K 17/06* (2006.01)
*H03K 19/003* (2006.01)

(52) U.S. Cl.
CPC ......... *H03K 17/687* (2013.01); *H03K 17/063* (2013.01); *H03K 19/00361* (2013.01)

(58) Field of Classification Search
CPC ............... H03K 17/063; H03K 17/687; H03K 19/00361
See application file for complete search history.

(56) References Cited

U.S. PATENT DOCUMENTS

| | | | |
|---|---|---|---|
| 9,601,920 B2 * | 3/2017 | Glas | H10D 89/60 |
| 2015/0188410 A1 * | 7/2015 | Takagiwa | H02M 7/537 |
| | | | 363/56.02 |

* cited by examiner

*Primary Examiner* — Menatoallah Youssef
*Assistant Examiner* — Colleen J O Toole
(74) *Attorney, Agent, or Firm* — Shumaker & Sieffert, P.A.

(57) ABSTRACT

A system includes a first driver circuit configured to drive a first switch, a second driver circuit configured to drive a second switch, and a controller arranged to control the first driver circuit and second driver circuit. The controller has an output terminal configured to output a control signal to a first level or a second level, the output terminal being connected to a control terminal of the first driver circuit and to an output terminal of the second driver circuit. The second driver circuit is arranged to drive the output terminal to the first level to indicate an error related to the second driver circuit. The first driver circuit is arranged to drive the first switch to operate in a safe state based on a determination that the control signal on the control terminal is at the first level.

20 Claims, 8 Drawing Sheets

INTER-DRIVER CONTROL SIGNAL

This application claims the benefit of U.S. Provisional Patent Application No. 63/362,852, filed Apr. 12, 2022, the entire contents of which is incorporated herein by reference.

TECHNICAL FIELD

This disclosure relates to driver circuits, for example, driver circuits configured to control power switches.

BACKGROUND

A power converter may use a half-bridge topology to drive a voltage or current. A high-side gate driver circuit drives a high-side gate of the half-bridge topology and a low-side gate driver drives a low-side gate of the half-bridge topology. For example, a three-phase motor may be controlled using, for each phase of the three-phase, a high-side driver circuit to switch the respective phase to a supply rail of a supply and a low-side driver circuit to switch the respective phase to a reference rail of the supply. In this manner, driver circuits for each phase may control a phase voltage for the three-phase motor.

SUMMARY

The disclosure describes techniques, devices, and systems for operating a first driver circuit (e.g., a low-side driver or a high-side driver of a half-bridge topology) in a safe state based on a control signal output by a second driver circuit (e.g., a high-side driver or a low-side driver of the half-bridge topology). For example, the second driver circuit may drive an output terminal of the second driver circuit to a first level (e.g., a logical 0 or 1) to indicate an error related to the second driver circuit (e.g., a ground fault). In this example, the output terminal of the second driver circuit is connected to a control terminal of the first driver circuit. The first driver circuit may operate in a safe state based on a determination that the control signal on the control terminal is at the first level, which may help to ensure that the first driver circuit does not switch-in a switch when the second driver circuit is not operating safe state, thereby improving a safety of the system.

In some examples, the disclosure is directed to a system including a first driver circuit configured to drive a first switch, a second driver circuit configured to drive a second switch, and a controller arranged to control the first driver circuit and second driver circuit. The controller has an output terminal configured to output a control signal to a first level or a second level, the output terminal being connected to a control terminal of the first driver circuit and to an output terminal of the second driver circuit. The second driver circuit is arranged to drive the output terminal to the first level to indicate an error related to the second driver circuit. The first driver circuit is arranged to drive the first switch to operate in a safe state based on a determination that the control signal on the control terminal is at the first level.

In some examples, the disclosure is directed to a device including a first driver circuit configured to drive a first switch, and a second driver circuit configured to drive a second switch. The second driver circuit is arranged to drive an output terminal of the second driver circuit to a first level to indicate an error related to the second driver circuit, the output terminal of the second driver circuit being connected to a control terminal of the first driver circuit and being configured to connect to an output terminal of a controller arranged to control the first driver circuit and the second driver circuit. The first driver circuit is arranged to drive the first switch to operate in a safe state based on a determination that the control signal on the control terminal of the first driver is at the first level.

In some examples, the disclosure is directed to a method that includes outputting, by a controller, a control signal at an output terminal of the controller to a first level or a second level. The output terminal of the controller is connected to a control terminal of a first driver circuit configured to drive a first switch and to an output terminal of a second driver circuit configured to drive a second switch. The method further includes driving, by the second driver circuit, the output terminal of the second driver circuit to the first level to indicate an error related to the second driver circuit. The method further includes driving, by the first driver circuit, the first switch to operate in a safe state based on a determination that the control signal on the control terminal of the first driver circuit is at the first level.

The details of one or more examples are set forth in the accompanying drawings and the description below. Other features, objects, and advantages of the disclosure will be apparent from the description and drawings, and from the claims.

DETAILED DESCRIPTION

Techniques described herein may include systems, methods, and devices using an inter-gate interface for error signaling. If a first driver circuit signals an error condition via the inter-gate interface, a second driver circuit connected to the first driver circuit may, in response to the error condition, force the related switch into a safe state (e.g., switching off or preventing switching on). Such techniques may be used in systems that enable signaling by a controller to allow software (SW) control, which may result in a reduction of pins at the driver circuits and/or at the controller. Moreover, the techniques described herein for an inter-gate interface for error signaling may be used with driver circuits configured for shoot through protection (STP) functionality.

Figure 1:
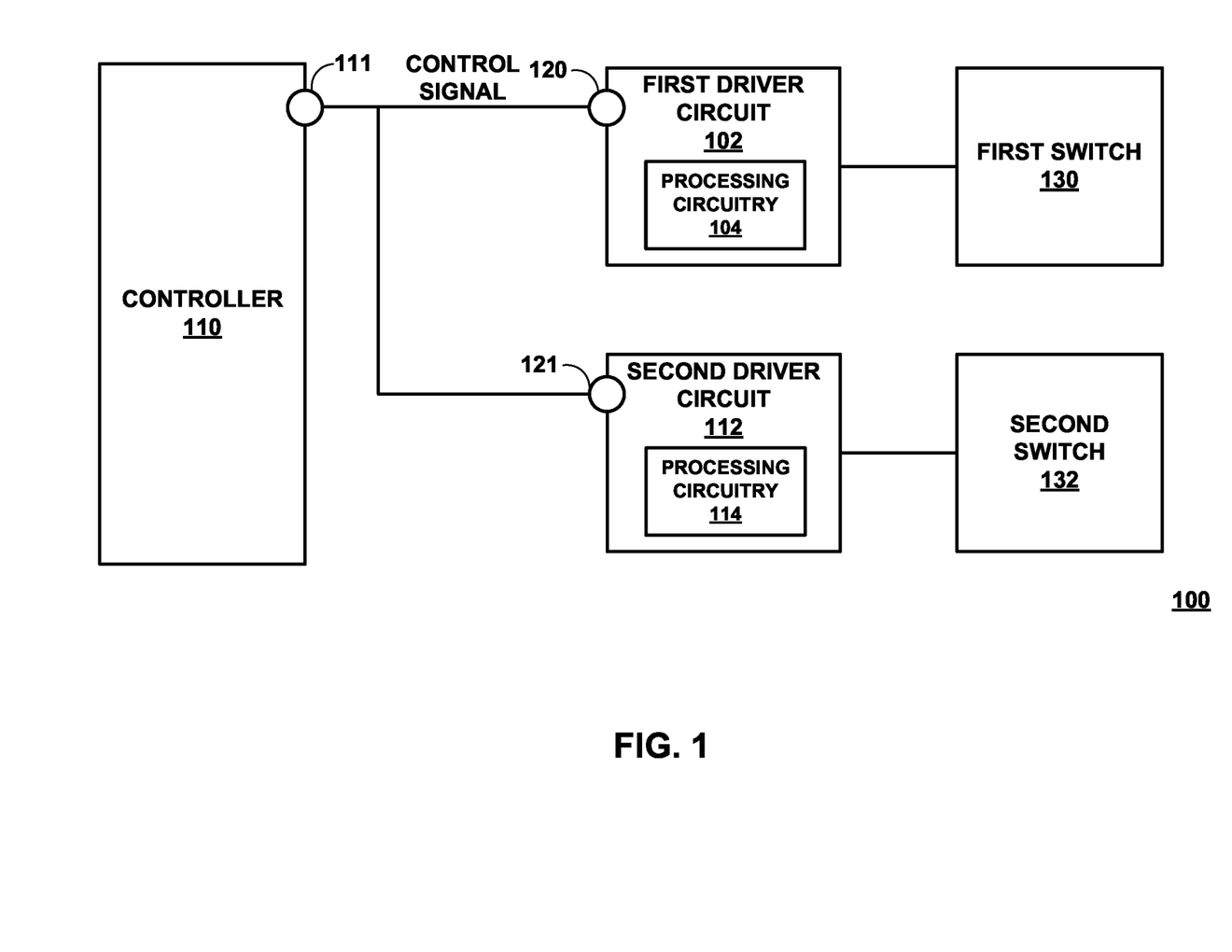
FIG. 1 is a block diagram illustrating an example system configured for inter-gate communication, in accordance with one or more techniques of this disclosure.

FIG. 1 is a block diagram illustrating an example system 100 configured for inter-gate communication, in accordance with one or more techniques of this disclosure. System 100 may include controller 110, first driver circuit 102, first switch 130, second driver circuit 112, and second switch 132.

Controller 110 may be configured to output a control signal at an output terminal 111. For example, controller 110 may generate the control signal to a first level (e.g., a logical 0 or 1) or a second level (e.g., a logical 1 or 0). Controller 110 may include one or more processors, such as one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry.

First driver circuit 102 may include processing circuitry 104 and control terminal 120. Control terminal 120 may be configured to receive the control signal from controller 110. First driver circuit 102 may control first switch 130 based on the control signal. For example, processing circuitry 104 may cause first driver circuit 102 to drive first switch 130 to a switched-out state when the control signal at control terminal 120 indicates the first level. In this example, processing circuitry 104 may cause first driver circuit 102 to drive first switch 130 to a switched-in state when the control signal at control terminal 120 indicates the second level and when first driver circuit 102 is operating in a safe state. Processing circuitry 104 may include one or more processors, such as one or more microprocessors, DSPs, ASICs, FPGAs, or any other equivalent integrated or discrete logic circuitry, as well as any combinations of such components.

First switch 130 may be configured to activate (e.g., switch-in) and deactivate (e.g., switch-out). For example, driver circuit 102 may drive first switch 130 to switch-in or switch-out using a control node or a gate. First switch 130 may represent a switching element. Examples of switching elements may include, but are not limited to, a silicon-controlled rectifier (SCR), a Field Effect Transistor (FET), and a bipolar junction transistor (BJT). Examples of FETs may include, but are not limited to, a junction field-effect transistor (JFET), a metal-oxide-semiconductor FET (MOSFET), a dual-gate MOSFET, an insulated-gate bipolar transistor (IGBT), any other type of FET, or any combination of the same. Examples of MOSFETS may include, but are not limited to, a depletion mode p-channel MOSFET (PMOS), an enhancement mode PMOS, depletion mode n-channel MOSFET (NMOS), an enhancement mode NMOS, a double-diffused MOSFET (DMOS), any other type of MOSFET, or any combination of the same. MOSFETS may be formed in silicon, gallium nitride (GaN), silicon carbide (SiC) or other semiconductor materials.

Second driver circuit 112 may include processing circuitry 114 and output terminal 121. Output terminal 121 may be connected to control terminal 120 of first driver circuit 102 and to output terminal 111 of controller 110. Processing circuitry 114 may cause second driver circuit 112 to drive output terminal 121 to the first level to indicate an error related to second driver circuit 112. Processing circuitry 114 may include one or more processors, such as one or more microprocessors, DSPs, ASICs, FPGAs, or any other equivalent integrated or discrete logic circuitry, as well as any combinations of such components.

Second switch 132 may be configured to activate (e.g., switch-in) and deactivate (e.g., switch-out). For example, second driver circuit 112 may drive second switch 132 to switch-in or switch-out using a control node or a gate. Second switch 132 may represent a switching element.

In accordance with the techniques of the disclosure, second driver circuit 112 may be arranged to drive output terminal 121 to the first level to indicate an error related to second driver circuit 112. First driver circuit 102 may be arranged to drive first switch 130 to operate in a safe state based on a determination that the control signal on control terminal 120 is at the first level.

For example, second driver circuit 112 may detect a severe fault, e.g. a short circuit at switch 132. In this example, second driver circuit 112 may signal the fault via a common interface formed by an electrical connection of output terminal 121 of second driver circuit 102 to control terminal 120 of first driver circuit 102 and to output terminal 111 of controller 110. First driver circuit 102 may detect the fault signaling by second driver circuit 112 at control terminal 120. In this example, first driver circuit 102 may prevent a switching on (or switching off) of switch 130. In some examples, controller 110 may optionally detect the fault signaling and may adjust the pulse-width modulated (PWM) patterns accordingly (e.g., to both switch-out). Driver circuits 102, 112 may optionally disable to prevent a switching-on of switches 130, 132 if controller 110 indicates a disable request (e.g. similar to a fault indication).

Figure 2:
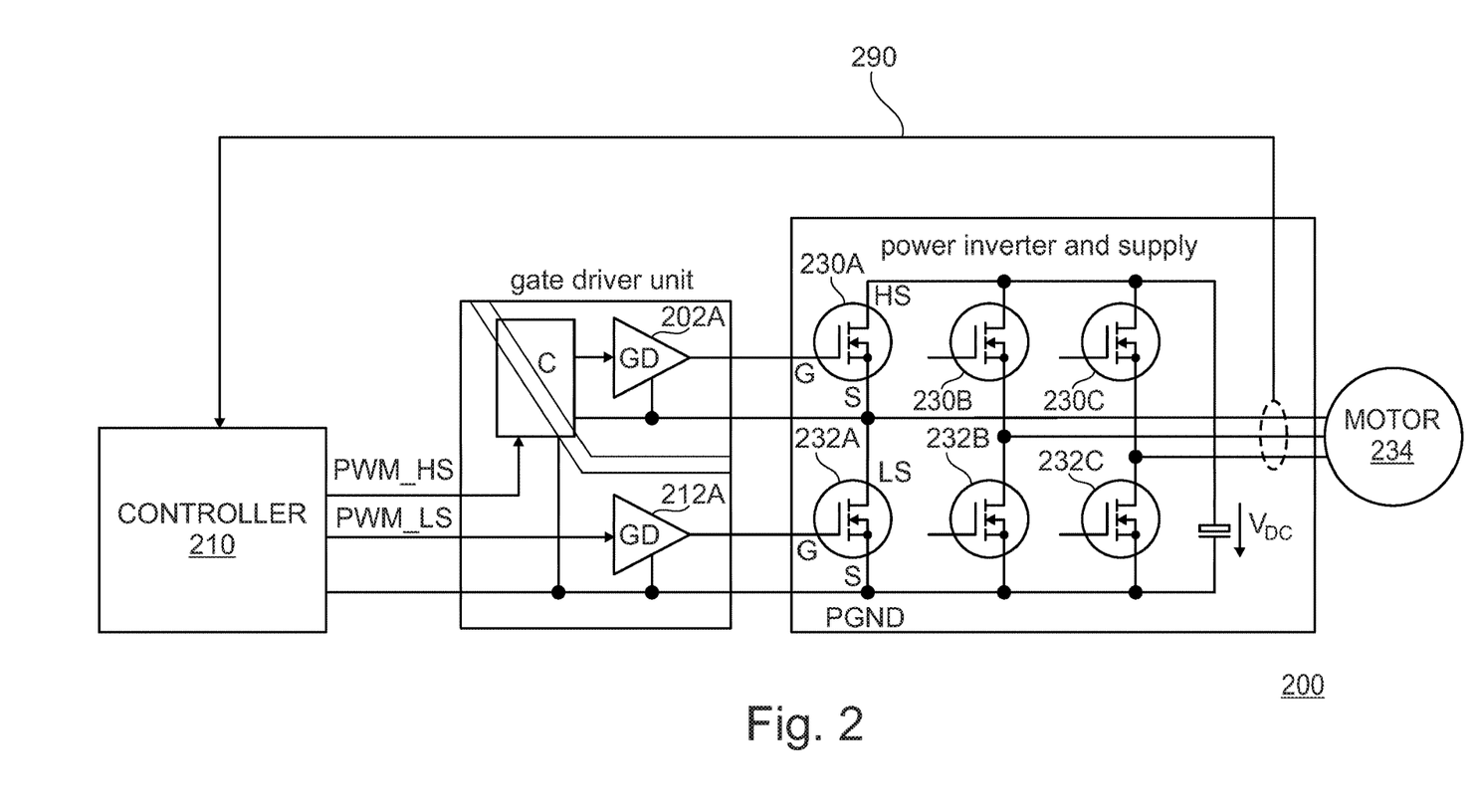
FIG. 2 is a block diagram illustrating an example system configured to drive a motor, in accordance with one or more techniques of this disclosure.

FIG. 2 is a block diagram illustrating an example system 200 configured to drive a motor 234, in accordance with one or more techniques of this disclosure. System 200 includes controller 210, gate driver circuit 202A, and gate driver circuit 212A which may be an examples of controller 110, first driver circuit 102, and second driver circuit 112, respectively. Switches 230A-230C (collectively, "switches 230") may represent high-side switches and switches 232A-232C (collectively, "switches 232") may represent low-side switches. In the example of FIG. 2, system 200 drives a motor (e.g., a three-phase motor), however, system 200 may drive other loads.

In the example of FIG. 2, a first phase of motor 234 may be driven by switches 230A and 232A, a second phase of motor 234 may be driven by switches 230B and 232B, and a third phase of motor 234 may be driven by switches 230C and 232C. While not shown, additional gate driver circuits may drive switches 230B, 232B, 230C, and 232C. Controller 210 may control driver circuit 202A and driver circuit 212A based on feedback 290. Techniques described herein for inter-gate communication can be applied to any power topology and are not limited to motor control. Examples described herein may apply to a half-bridge topology, often used for 3-phase AC drives, and/or other topologies.

FIG. 2 shows an example application block diagram for AC drive operation, e.g. for a 3-phase motor. Motor 234 may be connected to a power inverter structure that is connected to a supply unit delivering the energy to operate the motor (e.g., VDC). A phase current of motor 234 is considered as positive if the phase current flows from the inverter (e.g., switches 230, 232) to motor 234. A phase current of motor 234 is considered as negative if the phase current flows from motor 234 to the inverter.

System 200 includes a power inverter with a B6 topology. In a B6 topology, each phase of motor 234 is connected to a half-bridge switch topology with a high-side switch (e.g., HS, connecting the phase node to the positive supply rail of VDC) and a low-side switch (e.g., LS, connecting the phase node to the negative supply rail of VDC). Other topologies, such as multi-level converters, can be also used with techniques described herein for inter-gate communication.

A driver unit (e.g., driver circuit 202A, 212A) may represent a link between controller 210 generating the switching control signals (PWM_xy) to operate switches 230, 232 in the power inverter unit (on/off control). Each switch of switches 230,232 can be controlled by the controller 210, e.g. a microcontroller μC or any other type of PWM generation unit.

The gate driver unit may include several voltage domains, due to the structure of the B6 bridge, because each switch (e.g., power switch) uses a control signal with respect to a defined reference level (e.g. the source connection S of each switch). The example shows the symbols for MOSFET switches, however, other types of switching elements may be used, such as, for example, IGBTs, SiC, GaN switches, or other switching elements or combinations of switching elements.

Each switch of switches 230, 232 may be controlled by an individual control signal (G) that is adapted to the required voltage level by a gate driver (as part of the gate driver unit). In some cases, e.g. for power MOSFETs, several independent (smaller) switch devices are connected in parallel to increase the overall current capability of the parallel structure. In this description, such a parallel connection may also be considered as a single switch, because parallel switches form one bigger switch.

Figure 3:
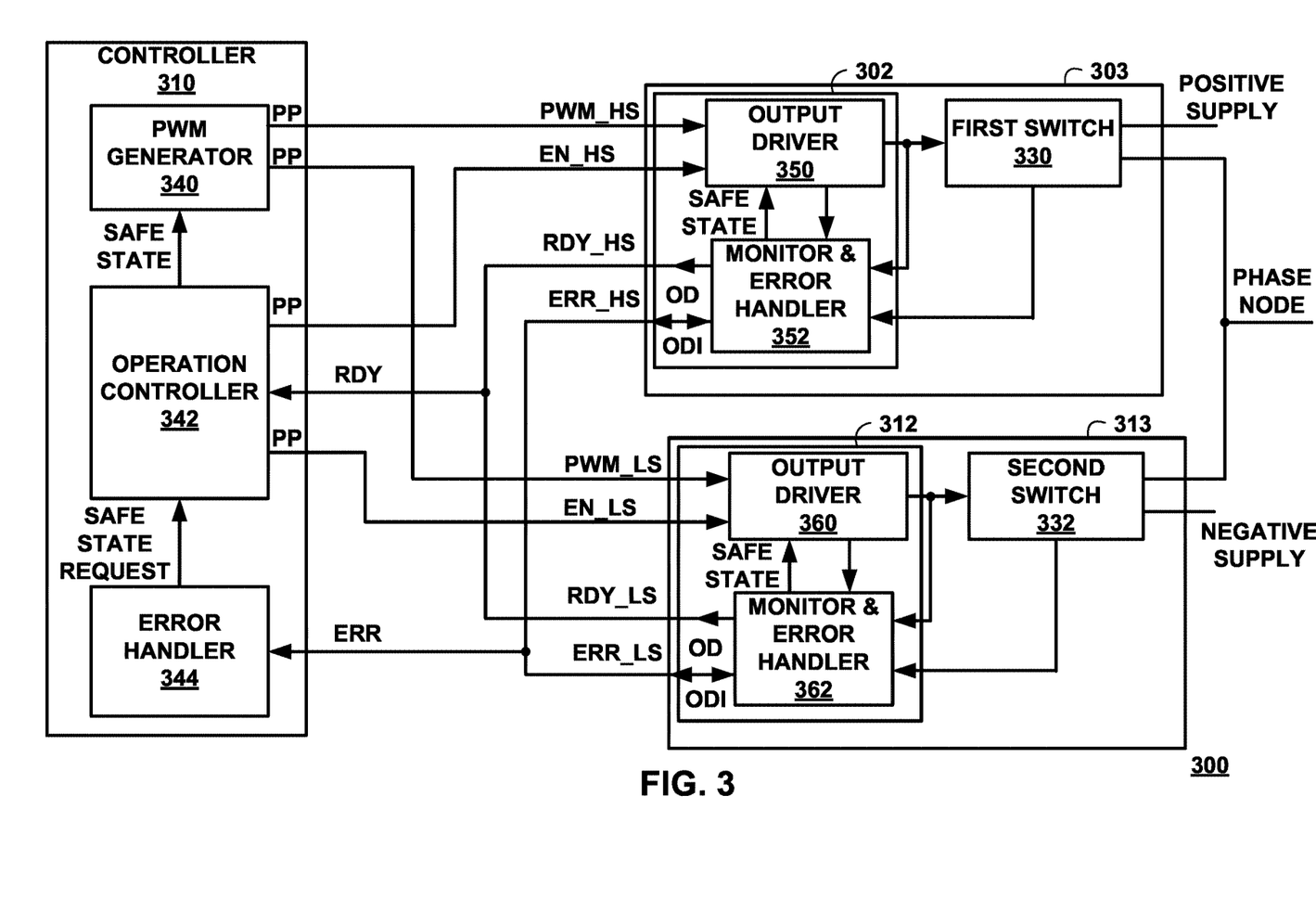
FIG. 3 is a block diagram illustrating a first example first driver circuit and a second driver circuit, in accordance with one or more techniques of this disclosure.

FIG. 3 is a block diagram illustrating a first example first driver circuit 302 and a second driver circuit 312, in accordance with one or more techniques of this disclosure. System 300 includes controller 310, high-side power unit 303, low-side power unit 313. Controller 310 may include a pulse-width modulation (PWM) generator 340, operation controller 342, and error handler 344. As shown, high-side power unit 303 includes gate driver circuit 302 and first switch 330, which may be examples of gate driver circuit 102 and first switch 130. Low-side power unit 313 includes gate driver circuit 312 and second switch 332, which may be examples of gate driver circuit 112 and second switch 132.

FIG. 3 shows an example block diagram of a half-bridge topology, including two power units, high-side power unit 303 and low-side power unit 313. PWM generator 340 (e.g. a micro-controller) may generate the PWM signals (e.g., PWM_HS, PWM_LS) to control the on/off switching of first switches 330 and second switch 332. The reference potentials inside power units 303, 313 may differ one from the other, relying on isolation barriers between power units 303, 313 or blocks inside power units 303, 313. For example, in HV applications (e.g., HV=high voltage; >60V, typically 200V-800V for automotive applications), isolation barriers may be built in between controller 310 and each one of power units 303, 313. The isolation barriers may be generally incorporated in the components of power units 303, 313.

Monitoring and error handler 352 may check for the operating conditions for first switch 330, e.g. for the correct supply voltage, current and voltage conditions at first switch 330, temperature, etc. Similarly, monitoring and error handler 362 may check for the operating conditions for second switch 332, e.g. for the correct supply voltage, current and voltage conditions at second switch 332, temperature, etc. Monitoring and error handlers 352, 362 may detect errors in power units 303, 313 (to allow fast reactions and self-protection of a power unit) and may also be signaled to controller 310 (to take remedial actions on higher level, e.g. stop PWM generator 340 or apply a safe PWM vector). In addition to error signaling, power units 303, 313 may also signal to controller 310 (e.g., operation controller 342) that they are available for operation (e.g. enough supply voltage available or temperature in a correct range), e.g. via a ready for operation signal (e.g., RDY_HS, RDY_LS).

An operation control function in controller 310 may control the generation of the PWM signals (e.g., PWM_HS, PWM_LS) by PWM generator 340 and may enable or disable power units 303, 313 depending on information on a higher system level (e.g. motor operation not needed).

In the example of FIG. 3, the error and/or ready signals may be shared between the power units 303, 313 for high-side (HS) and low-side (LS) operation. This may be beneficial for reducing a number of pins needed at controller 310 (e.g. micro-controller). In this example, output stages for the signals ERR_HS and ERR_LS may be built as open-drain structures (e.g., ODI) that allow either connecting the output to a GND reference potential or tri-state (leave the output signal as is). A pull-up device (e.g. a resistor to a positive reference potential, e.g. 5 V) may be used to operate a shared open-drain output.

In some applications, the RDY outputs of all HS power units may be combined to a common RDY_HS signal, similar for the RDY outputs of all LS power units combined to a common RDY_LS signal. The combination of combining several RDY or ERR signals from several power units to common signals is shown in FIG. 3, for the example of a common RDY and a common ERR signal for the half-bridge.

An example way to achieve a combined signal may include using an open-drain output stage (OD). Such output stage can either drive a low level (e.g. 0 V) or the output is high-ohmic (tri-state). This allows a simple connection of several outputs in parallel. If there is at least one output driving low level, the common line shows a low level. To achieve a high level, at least one pull-up device (e.g. a resistor connected to a positive interface supply voltage) is needed that pulls the signal to a high level when all outputs are high-ohmic. The pull-up device may be included in the input stage of the device reading the common signal, e.g. an input of the control unit. Contrary to an open-drain output, a push-pull (PP) output stage allows driving a low level (e.g. 0 V) or a high level (e.g. interface supply). A PP output stage can drive several input stages, but cannot be directly connected to another PP stage (to avoid interfering output drivers) to form a common signal.

Different options for integrating the functional units into integrated circuits (ICs) are possible. An example way of integrating the functional units into ICs is to integrate an interface for the signals to controller 310, an isolation barrier, an output driver and a monitoring and error handling unit into an integrated device (e.g., a gate driver). Gate driver circuits 302, 303 may be single channel to control a single switch or 2-channel, which may include two isolated drivers for two separate switches, e.g. one gate driver device for the two switches of one half-bridge. In some cases, also 6 driver units may be integrated to control a complete B6 bridge (3 independent half-bridges).

For gate driver circuits for a single switch, the interface to controller 310 may include all signals for handling the driver units and the monitoring and error handling. Such a topology has the advantage that the gate driver circuits can be considered independently (e.g. for safety considerations). But there might be a drawback regarding reaction time in case of severe failures of the switches because the error handling on half-bridge level (e.g. in case of a short circuit of one switch) may be based on a reaction of controller 310, which may be relatively slow compared to a reaction time of driver circuits 302, 303.

In such systems, even if one driver circuit detects such an error, the signaling does not target the "neighbor" driver circuit (e.g. of the same half-bridge), but always includes a reaction of controller 310. This may lead to longer reaction times and the need that controller 310 is operable. The need for operability of controller 310 may lead to costs, because controller 310 may be configured to be supplied and running in a safety context. A direct link between two independent gate drivers could be beneficial to avoid that a driver circuit switches on a switch if the neighbor has detected and signaled a severe error, such as a short circuit. However, in some systems, the OD output stages do not have functional input capability. This means that the driver circuit does not change its functional behavior if the common signal is at low level due to another device signaling low level. There may be the option to monitor the input level (e.g. to check for a stuck-at condition), but there is no operating function associated as an input function.

In accordance with the techniques of the disclosure, a signaling structure may be used to change a functional behavior of power units 303, 313 if the common signal is at low level due to another device signaling low level. In the example of FIG. 3, the ERR outputs of gate driver circuits 302, 312 may provide functional input capability, in addition to open-drain functionality (named here ODI=open-drain with input), as shown in FIG. 4.

In the example of FIG. 3, the combined ERR signal may not only be used as an error input for controller 310, but also, the combined ERR signal may be used by each connected driver circuit 302, 312. This structure may allow a protection of all connected driver circuits against severe failures (e.g. a short circuit condition of one switch) without interaction with controller 310.

Figure 4:
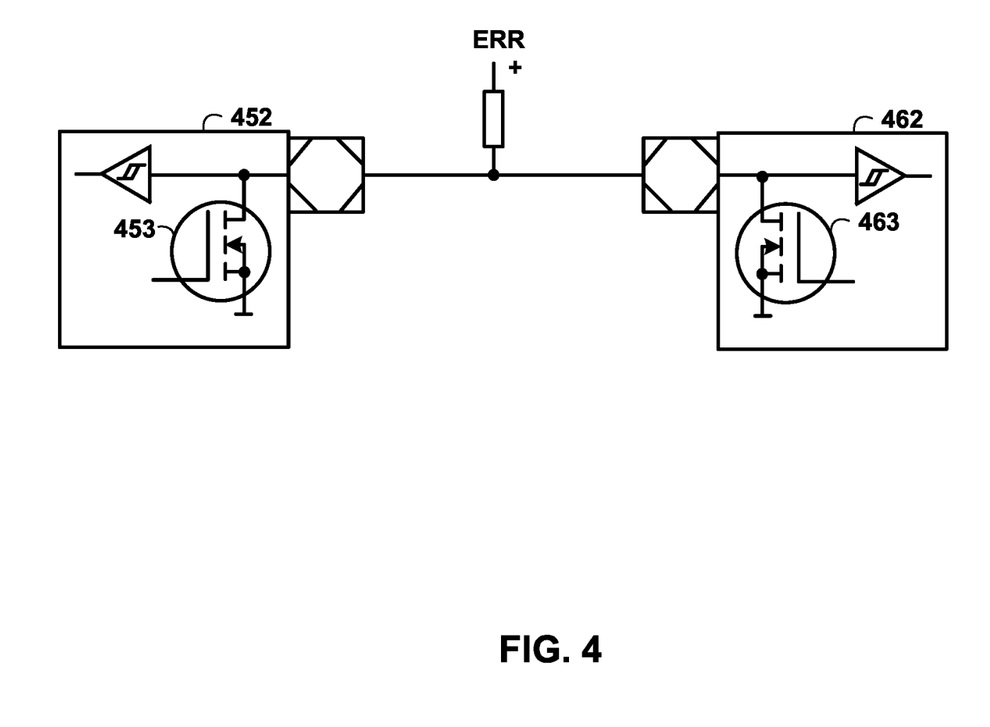
FIG. 4 is a block diagram illustrating an example open-drain with input (ODI), in accordance with one or more techniques of this disclosure.

FIG. 4 is a block diagram illustrating an example open-drain with input (ODI), in accordance with one or more techniques of this disclosure. In this example, monitoring and error handler 452 may include a n-channel MOSFET 453 configured to drive the error signal (ERR). Similarly, monitoring and error handler 462 may include a n-channel MOSFET 463 configured to drive the error signal (ERR).

In accordance with the techniques of the disclosure, the driver circuit to driver circuit communication interface shown in FIG. 4 could help to reduce reaction time and effort for error handling on system level. In other words, if one driver circuit detects and signals a severe error, the neighbor driver circuit should be capable of reacting immediately. The reaction may include switching off or prevent switching on. If a driver circuit detects and signals a short circuit of the related switch via an error output interface, the neighbor driver circuit may include an input interface to read this information.

Figure 5:
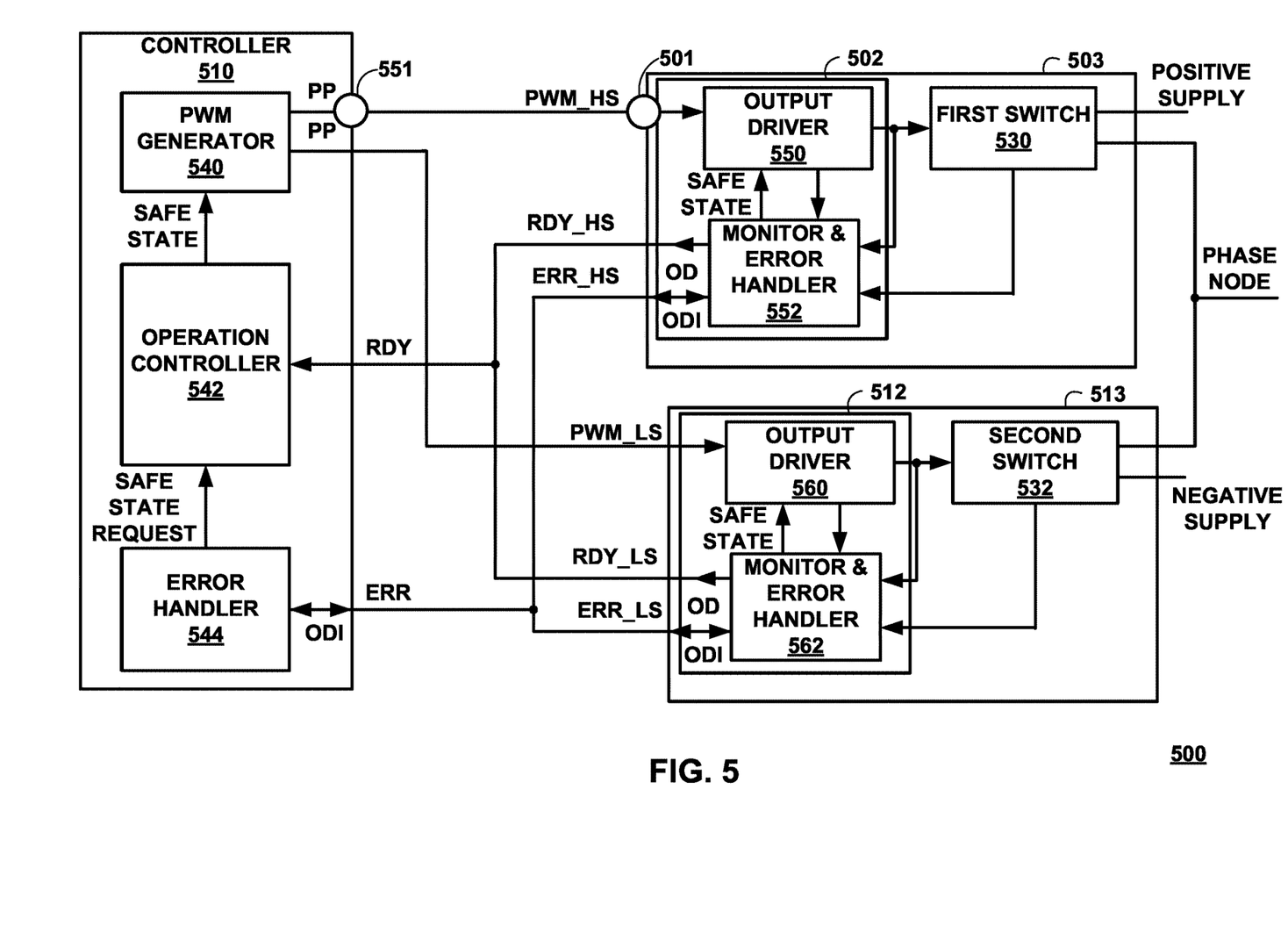
FIG. 5 is a block diagram illustrating a second example first driver circuit and a second driver circuit, in accordance with one or more techniques of this disclosure.

FIG. 5 is a block diagram illustrating a second example first driver circuit 502 and a second driver circuit 512, in accordance with one or more techniques of this disclosure. System 500 includes controller 510, high-side power unit 503, low-side power unit 513. Controller 510 may include a pulse-width modulation (PWM) generator 540, operation controller 542, and error handler 544. As shown, high-side power unit 503 includes first driver circuit 502 and first switch 530, which may be examples of first driver circuit 102 and first switch 130. First driver circuit 502 may include output driver 550, which is configured to drive first switch 530 based on a switching signal (e.g., PWM_HS) from PWM generator 540. Low-side power unit 513 includes second driver circuit 512 and second switch 532, which may be examples of second driver circuit 112 and second switch 132. Second driver circuit 512 may include output driver 560, which is configured to drive second switch 532 based on a switching signal (e.g., PWM_LS) from PWM generator 540.

In the example of FIG. 5, the common ERR signal can also be used for one or more additional purposes. In some gate driver circuits, there is an enable signal that enables the driver output under control of controller 510 (e.g. under software (SW) control during start-up or depending on the application operation). The enable function may force switches 530, 532 to the same behavior (switched off), either in case of an internal error condition (detected by the "own" monitoring and error handling unit) or under SW control (EN signal being inactive).

Leading to the same behavior of the switch, the enable and error functions may be combined with the ERR signal, as shown in FIG. 5. In this way, gate driver circuit to gate driver circuit communication interface (e.g., the ODI interfaces at error handler 544 and monitor and error handlers 552, 562) may be used for one or more of the following purposes: (1) indicate an error detected at a switch related to the gate driver; (2) receive an error indication detected by another gate driver circuit to keep or switch off the switch; or (3) receive an enable information from the control unit (e.g., to allow SW interaction, switch off under SW control).

The connection to controller 510 may be used to enable or disable operation of power units 503, 513 under SW control or receive an error indication detected by one of the gate driver circuits 502, 512. In this way, techniques herein may help to provide one or more of: (1) a reduced pin count at gate driver circuits (e.g., costs) if combining ERR and EN; (2) using an available pin as an interface for a (single-wire) communication interface with controller 510, e.g. a half-duplex UART communication interface; or (3) faster reaction of neighbor gate driver circuits to severe errors due to direct connection, instead of path via controller 510.

In accordance with the techniques of the disclosure, second driver circuit 512 is arranged to drive a control signal (e.g., error signal ERR_HS) to a first level to indicate an error related to second driver circuit 512. First driver circuit 502 may be arranged to drive first switch 530 to operate in a safe state (e.g., switched-out) based on a determination that the control signal on control terminal 120 is at the first level. In some examples, controller 510 may be arranged to drive an output terminal to the first level to signal to first driver circuit 502 to drive first switch 530 to operate in the safe state.

As shown, controller 510 may have a first terminal 551 configured to output a first switching signal (PWM_HS). First terminal 551 of controller 510 may be connected to a first terminal 501 of first driver circuit 502. In this example, first driver circuit 502 is configured to drive first switch 530 based on the first switching signal on first terminal 501 of first driver circuit 502 when first switch 530 is not operating in the safe state.

Figure 6:
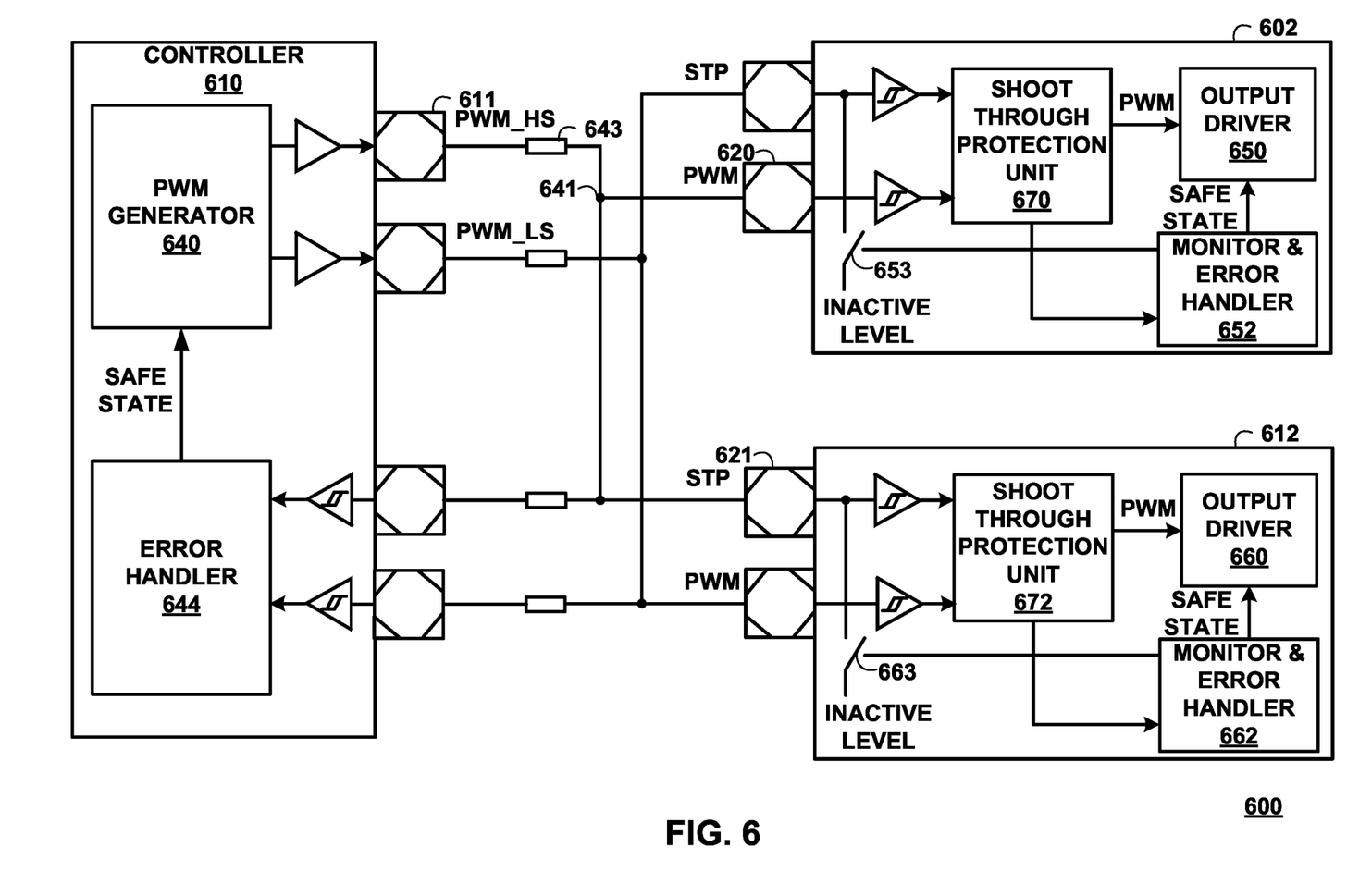
FIG. 6 is a block diagram illustrating a third example first driver circuit and a second driver circuit, in accordance with one or more techniques of this disclosure.

FIG. 6 is a block diagram illustrating a third example of first driver circuit 602 and a second driver circuit 612, in accordance with one or more techniques of this disclosure. System 600 includes controller 610, first driver circuit 602, and second driver circuit 612. Controller 610 may include a pulse-width modulation (PWM) generator 640 and error handler 644. First driver circuit 602 may include shoot through protection unit 670, output driver 650, and monitor and error handler 652. Second driver circuit 612 may include shoot through protection unit 672, output driver 660, and monitor and error handler 662. While the example of FIG. 6 illustrates first driver circuit 602 as a high-side gate driver circuit and second driver circuit 612 as a low-side gate driver circuit, in some examples, a first driver circuit may be a low-side gate driver circuit and the second driver circuit may be a high-side gate driver circuit.

The example of FIG. 6 may represent an alternative error signaling scheme from FIG. 5 between two neighbor gate driver circuits. This example signaling techniques use a shoot through protection (STP) function that may be implemented in each one of driver circuits 602, 612. There may be the risk of an unintended activation of both PWM control signals (for the high-side and the low-side) due to an error condition or failure in controller 610 or in the wiring. A simultaneous activation of both switches in a half-bridge topology would lead to a bridge short circuit (called shoot through) and could lead to damage in the power stages.

To increase robustness against unintended simultaneous activation of both PWM signals, driver circuits 602, 612 may include a shoot through protection (STP) function. For example, first driver circuit 602 may include shoot through protection unit 670 and second driver circuit 612 may include shoot through protection unit 672. Driver circuits 602, 612 may receive both PWM signals (e.g., PWM_HS and PWM_LS) and interpret one PWM signal as an "intended" PWM control signal (e.g. at its input PWM), whereas the other PWM signal is interpreted as gating signal. Shoot through protection unit 670 may be configured to help to provide shoot through protection that avoids switching on the first switch if the control signal at the STP input shows an active level (e.g., switched-in). In this way, shoot through protection units 670, 672 may use the PWM signal of one driver circuit as an STP input signal of the neighbor driver circuit. As such, both driver circuits 602, 612 "see" both PWM signals generated by controller 610 and both driver circuits 602, 612 can check for signal integrity.

The following Table 1 gives an example of an STP function that may be performed by shoot through protection units 670, as implemented in a first driver circuit 602 driving a first switch:

TABLE 1

| PWM input | STP input | First switch | Comment |
|---|---|---|---|
| Inactive | inactive | Blocking state (off) | Idle state of half-bridge, both switches off |
| Active | inactive | Conducting state (on) | Normal operation, first switch active |
| Inactive | active | Blocking state (off) | Normal operation, neighbor switch |
| Active | active | Blocking state (off) | Error case, both switches off |

First driver circuit 602 may be configured to drive a first switch based on the control signal on control terminal 620 of first driver circuit 602 when the first switch is not operating in the safe state. For example, shoot through protection unit 670 may be configured to set output driver 650 to drive a first switch (e.g., a high-side switch) based on a switching signal (e.g., "PWM_HS) output by PWM generator 640 and a shoot through signal (e.g., PWM_LS) output by PWM generator 640. For example, shoot through protection unit 670 may be configured to set output driver 650 to drive, when the shoot through signal (e.g., PWM_LS) does not indicate that an error has occurred (e.g., both a first switch and a second switch are switched-in), the first switch to a first level when the switching signal (e.g., "PWM_HS) indicates the first level and to a second level when the switching signal indicates the second level. Output driver 650 may be configured to drive the first switch based on a switching signal (e.g., PWM) from shoot through protection unit 670. Monitor and error handler 652 may set output driver 650 to operate in a safe state when shoot through protection unit 670 determines that an error has occurred at first driver circuit 602.

Similarly, second driver circuit 612 may be configured to drive a second switch based on a control signal on an output terminal (e.g., PWM) of second driver circuit 612 when the second switch is not operating in the safe state. For example, shoot through protection unit 672 may be configured to set output driver 660 to drive a second switch (e.g., a low-side switch) based on a switching signal (e.g., "PWM_LS) output by PWM generator 640 and a shoot through signal (e.g., PWM_HS) output by PWM generator 640. For example, shoot through protection unit 672 may be configured to set output driver 660 to drive, when the shoot through signal (e.g., PWM_HS) does not indicate that an error has occurred (e.g., both a first switch and a second switch are switched-in), the second switch to a first level when the switching signal (e.g., "PWM_LS) indicates the first level or to a second level when the switching signal indicates the second level. Output driver 660 may be configured to drive the second switch based on a switching signal (e.g., PWM) from shoot through protection unit 670. Monitor and error handler 662 may set output driver 660 to operate in a safe state when shoot through protection unit 672 determines that an error has occurred at second driver circuit 612.

In some examples, there may be a significant a distance (e.g., more than 5 cm) between the outputs of PWM generator 640 in controller 610 and the inputs of the driver circuits 602, 612. To increase robustness against unintended stuck-at errors of the wiring on a PCB or a connector, a current limiting element, such as, for example, a series resistor (e.g. about 1 kOhm), may be introduced between the output of PWM generator 640 and the signal path with the long wiring (e.g., series resistor is normally quite close to an output stage). The current limiting element may help to limit the current in case of a short circuit on the signaling path and may help to protect the output stage.

In the example of FIG. 6, override unit 653 of first driver circuit 602 may provide an alternative signaling from the "safe state" signaling from monitor and error handler 652 to output driver 650. For example, override unit 653 may be configured to force the level at the PWM input (e.g., STP) of first driver circuit 602 to another value compared to the level (e.g., PWM_LS) generated by PWM generator 640 of controller 610. Similarly, override unit 663 may be configured to force the level at the PWM input (e.g., STP) of second driver circuit 612 to another value compared to the level (e.g., PWM_HS) generated by PWM generator 640 of controller 610.

For example, when first driver circuit 602 (e.g., monitor and error handler 652) detects an error (e.g. a short circuit in the first switch), first driver circuit 602 (e.g., monitor and error handler 652) can internally set output driver 650 to a safe state and switch off the first switch). In this way, output driver 650 may be controlled independently from controller 610 (e.g., PWM generator 640).

In accordance with the techniques of the disclosure, first driver circuit 602 (e.g., override unit 653) may force a level at an input pin (becoming an output, at least while the error is signaled). Due to a series resistance (e.g., a resistor), current delivered by the outputs of controller 610 may be limited and may prevent destruction of the output stages. There may be different ways how to overdrive the PWM control signals delivered by controller 610. For example, override unit 653 may drive the STP pin on driver circuit 602 to an inactive level (e.g., to cause output driver to switch-out the first switch). In some examples (see FIG. 7), an override unit may drive the PWM pin on driver circuit 602 to an active level, which may help to force the PWM input of driver circuit 612 to an inactive level (e.g., force the half-bridge topology to an idle state).

To avoid overdriving outputs of PWM generator 640 for a long time interval, controller 610 may be equipped with inputs connected to the actual inputs of driver circuits 602, 612 to check for signal integrity between the actual signal at driver circuits 602, 612 and the intended level. In response to a detection of a mismatch (longer than a threshold related to a normal propagation delay of the signals, for example, 12 s), PWM generator 640 may be configured to stop or set to a safe state pattern, e.g. the idle pattern.

For example, system 600 may include a current limiting element 643 (e.g., a resistor) between output terminal 611 of controller 610 and a node 641. As shown, node 641 may be between (e.g., may electrically connect) an output terminal 621 of second driver circuit 612 and a control terminal 620 of first driver circuit 602. Current limiting element 643 may limit current from output terminal 611 of controller 610 such that if second driver circuit 612 drives the control signal to a first level, control terminal 620 of first driver circuit 602 is driven to the first level even if controller 610 drives output terminal 611 of controller 610 to a different level than the first level.

Figure 7:
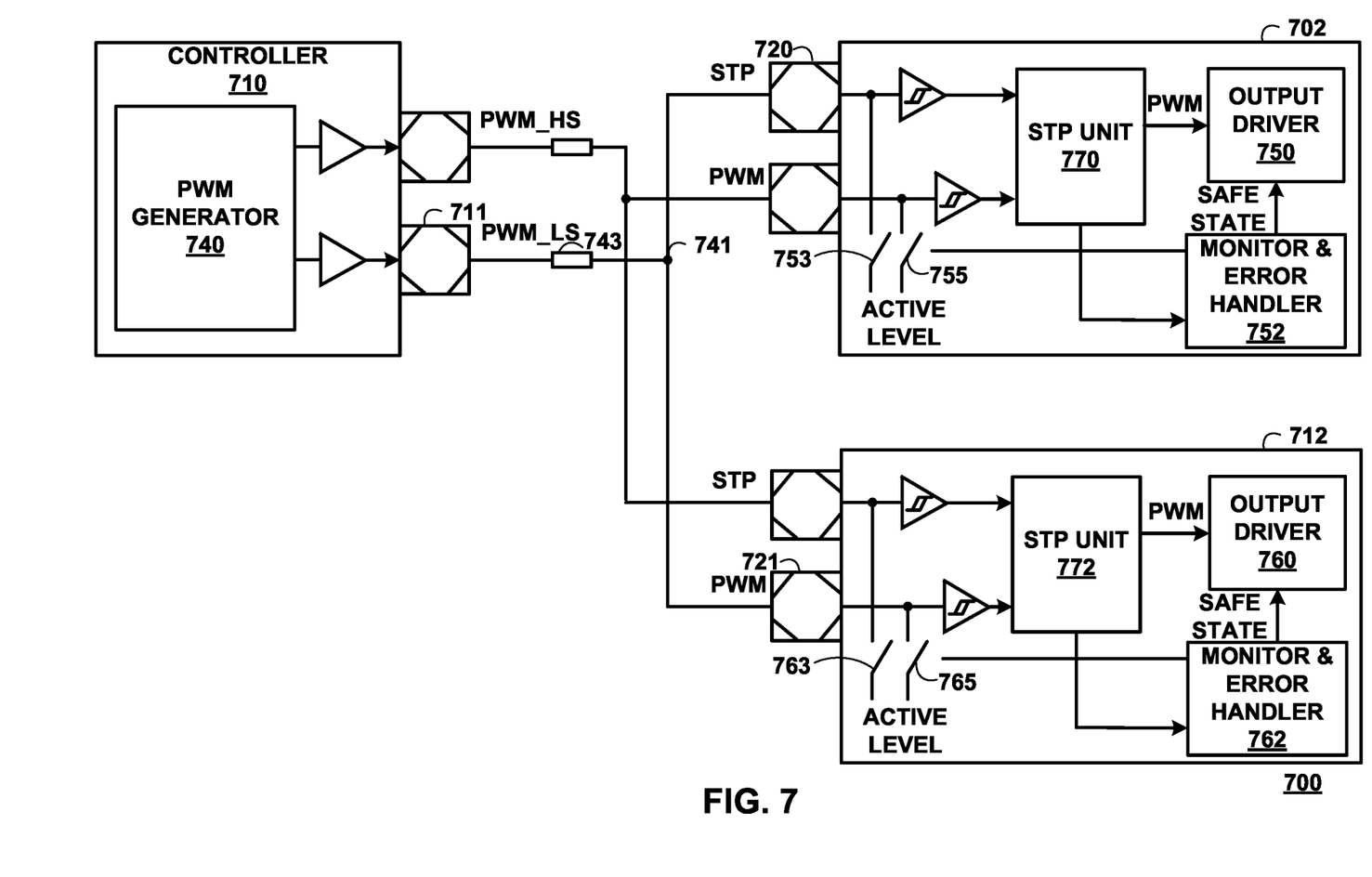
FIG. 7 is a block diagram illustrating a fourth example first driver circuit and a second driver circuit, in accordance with one or more techniques of this disclosure.

FIG. 7 is a block diagram illustrating a fourth example first driver circuit 702 and a second driver circuit 712, in accordance with one or more techniques of this disclosure. System 700 includes controller 710, first driver circuit 702, and second driver circuit 712. Controller 710 may include a pulse-width modulation (PWM) generator 740. While not shown, controller 710 may include an error handler. First driver circuit 702 may include shoot through protection unit 770, output driver 750, and monitor and error handler 752. Second driver circuit 712 may include shoot through protection unit 772, output driver 760, and monitor and error handler 762. While the example of FIG. 7 illustrates first driver circuit 702 as a high-side gate driver circuit and second driver circuit 712 as a low-side gate driver circuit, in some examples, a first driver circuit may be a low-side gate driver circuit and the second driver circuit may be a high-side gate driver circuit.

In the example of FIG. 7, overdrive units 753, 755 may signal an error to overdrive the input signals towards active level to force a failure indication. In this example, both inputs of driver circuit 712 see an active level and the local shoot through protection reacts. If such a condition is detected (e.g., for longer than just a few μs or even below), shoot through protection unit 770 may react, store the detected error event, and disables output driver 750 until the stored error indication is released by controller 710 (e.g. by a clear error signaling, not shown in the FIGS.).

Similarly, overdrive units 763, 765 may signal an error to overdrive the input signals towards active level to force a failure indication. In this example, both inputs of driver circuit 702 see an active level and the local shoot through protection reacts. If such a condition is detected (for longer than just a few μs or even below), shoot through protection unit 772 may react, store the detected error event, and disables output driver 760 until the stored error indication is released by controller 710 (e.g. by a clear error signaling, not shown in the FIGS.).

As shown in FIG. 7, at least the PWM input pin (e.g., also the STP input pin, to be independent from PWM timing of the control unit) is forced to active level. In this case, the internal error handling of driver circuits 702, 712 forces the gate driver output state to a safe state (e.g., switched off), independent from the actual value at the PWM input. In this way, the PWM input (and the STP) input can be temporarily used as outputs to force the input signal(s) to active level. The neighbor gate driver may detect a shoot through error and may set the related gate driver output stage also to a safe state (e.g., switched off). For example, override units 753, 755 may drive the PWM pin on driver circuit 702 to an active level, which may help to force the PWM and STP inputs of driver circuit 712 to an inactive level (e.g., force the half-bridge topology to an idle state). Similarly, override units 763, 765 may drive the PWM pin on driver circuit 712 to an active level, which may help to force the PWM and STP inputs of driver circuit 702 to an inactive level (e.g., force the half-bridge topology to an idle state).

Because the reaction time of STP units 770, 772 is quite short compared to controller 710, there is no need for a long overdrive time interval (a few μs are enough). As a consequence, there is no need for controller 710 to monitor the signal integrity at the driver circuits 702, 712 because the output of the PWM control signals can easily survive a short overdrive interval. The STP error can be easily signaled to controller 710 via the normal ERR interface (e.g., as shown in the other figures before).

Second driver circuit 712 may be arranged to drive the control terminal of the second driver circuit to the first level if the second switch operates in the safe state. For example, system 700 may include a current limiting element 743 (e.g., a resistor) between second output terminal 711 of controller 710 and a node 741. As shown, node 741 may be between (e.g., may electrically connect) a control terminal 721 of second driver circuit 712 and an output terminal 720 of first driver circuit 702. Current limiting element 743 may limit current from second output terminal 711 of controller 710 such that if second driver circuit 712 drives the control signal to a second level, output terminal 720 of first driver circuit 702 is driven to the second level even if controller 710 drives second output terminal 711 of controller 710 to a different level than the second level. Second output terminal 711 may be configured to output a second control signal for a second switch (e.g., controlled by output driver 760) to the first level or the second level. Second output terminal 711 may be connected to a control terminal (e.g., PWM) of second driver circuit 712 and to an output terminal (e.g., STP) of the first driver circuit 702.

Figure 8:
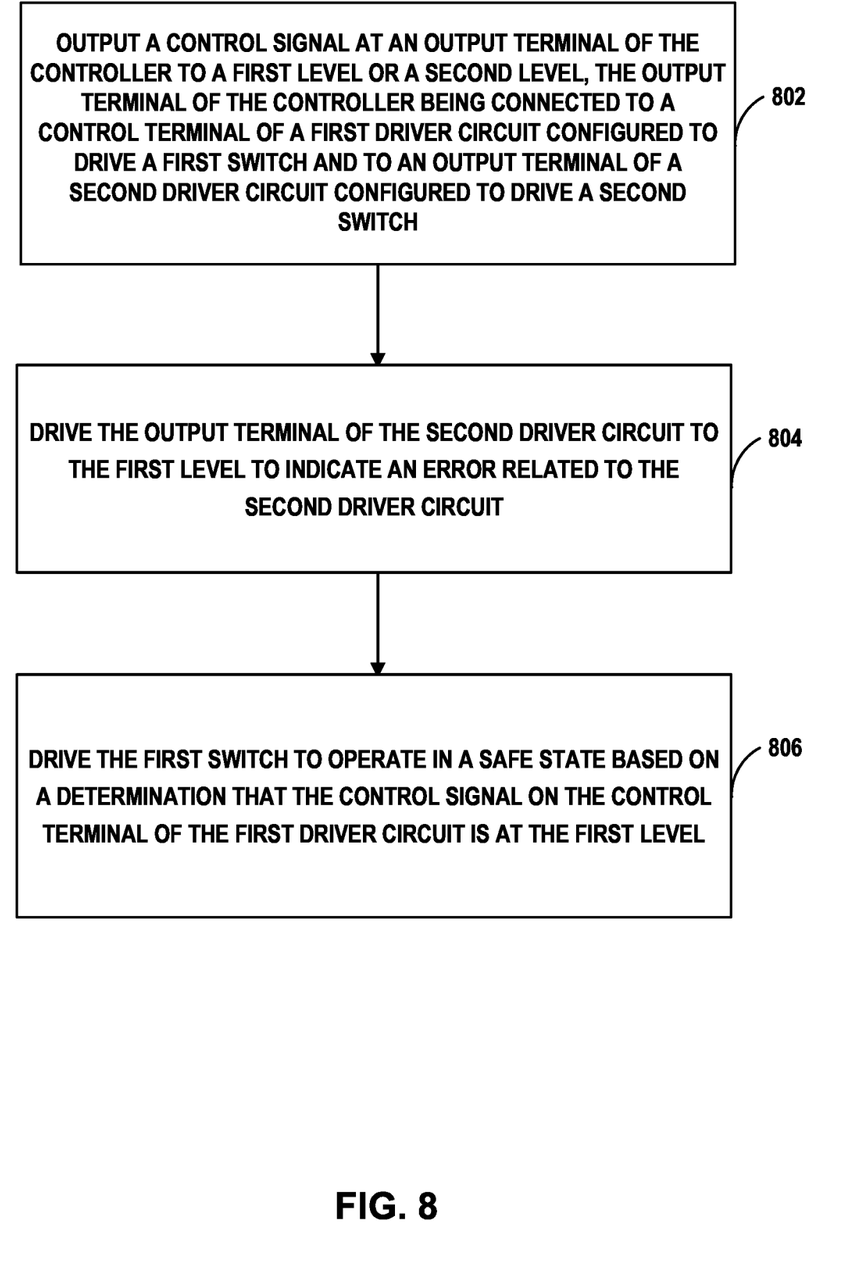
FIG. 8 is a flow diagram consistent with techniques that may be performed by a device, in accordance with this disclosure.

FIG. 8 is a flow diagram consistent with techniques that may be performed by a device, in accordance with this disclosure. FIG. 8 is discussed with FIGS. 1-7 for example purposes only.

Controller 110 may output a control signal at an output terminal 111 of controller 110 to a first level or a second level (802). The output terminal 111 of controller 110 may be connected to control terminal 120 of first driver circuit 102 and to output terminal 121 of second driver circuit 112. Controller 110 may be arranged to drive output terminal 111 to the first level to signal to first driver circuit 102 to drive first switch 130 to operate in the safe state (see ERR of FIG. 5). In some examples, controller 110 may be configured to generate a switching signal (e.g., PWM) with a first level or a second level at output terminal 111 (see FIGS. 6, 7).

Second driver circuit 112 may drive output terminal 121 of second driver circuit 112 to the first level to indicate an error related to second driver circuit 112 (804). For example, second driver circuit 112 may be arranged to drive a control signal (e.g., error signal ERR_HS) to a first level to indicate an error related to second driver circuit 112 (see FIG. 5). In some examples, a current limiting element may limit current from output terminal 111 of controller 110 such that if second driver circuit 112 drives the control signal to a first level, control terminal 120 of first driver circuit 102 is driven to the first level even if controller 110 drives output terminal 111 of controller 610 to a different level than the first level (see FIGS. 6, 7). First driver circuit 102 may drive, first switch 130 to operate in a safe state based on a determination that the control signal on control terminal 120 of first driver circuit 102 is at the first level (806).

The following clauses may illustrate one or more aspects of the disclosure.

Clause 1. A system comprising: a first driver circuit configured to drive a first switch; a second driver circuit configured to drive a second switch; a controller arranged to control the first driver circuit and second driver circuit; wherein the controller has an output terminal configured to output a control signal to a first level or a second level, the output terminal being connected to a control terminal of the first driver circuit and to an output terminal of the second driver circuit; wherein the second driver circuit is arranged to drive the output terminal to the first level to indicate an error related to the second driver circuit; and wherein the first driver circuit is arranged to drive the first switch to operate in a safe state based on a determination that the control signal on the control terminal is at the first level.

Clause 2. The system according to clause 1, wherein the controller is arranged to drive the output terminal to the first level to signal to the first driver circuit to drive the first switch to operate in the safe state.

Clause 3. The system according to clause 2, wherein the controller has a first terminal configured to output a first switching signal, the first terminal of the controller being connected to a first terminal of the first driver circuit; and wherein the first driver circuit is configured to drive the first switch based on the first switching signal on the first terminal of the first driver circuit when the first switch is not operating in the safe state.

Clause 4. The system according to any of clauses 1-3, wherein the control signal comprises an error signal.

Clause 5. The system according to any of clauses 1-4, further comprising: a node between the output terminal of the second driver circuit and the control terminal of the first driver circuit; and a current limiting element between the output terminal of the controller and the node such that if the second driver circuit drives the control signal to the first level, the control terminal of the first driver circuit is driven to the first level even if the controller drives the output terminal of the controller to a different level than the first level.

Clause 6. The system according to clause 5, wherein the first driver circuit is configured to drive the first switch based on the control signal on the output terminal of the first driver circuit when the first switch is not operating in the safe state.

Clause 7. The system according to any of clauses 5-6, wherein the controller further has a second output terminal configured to output a second control signal for the second switch to the first level or the second level, the second output terminal being connected to a control terminal of the second driver circuit and to an output terminal of the first driver circuit; and wherein the second driver circuit is arranged to drive the control terminal of the second driver circuit to the first level if the second switch operates in the safe state.

Clause 8. The system according to clause 7, wherein the second driver circuit is configured to drive the second switch based on the second control signal when the second switch is not operating in the safe state.

Clause 9. A device comprising: a first driver circuit configured to drive a first switch; a second driver circuit configured to drive a second switch; wherein the second driver circuit is arranged to drive an output terminal of the second driver circuit to a first level to indicate an error related to the second driver circuit, the output terminal of the second driver circuit being connected to a control terminal of the first driver circuit and being configured to connect to an output terminal of a controller arranged to control the first driver circuit and the second driver circuit; and wherein the first driver circuit is arranged to drive the first switch to operate in a safe state based on a determination that the control signal on the control terminal of the first driver is at the first level.

Clause 10. The device according to clause 9, wherein the first driver circuit is arranged such that the controller drives the output terminal of the first driver circuit to the first level to signal to the first driver circuit to drive the first switch to operate in the safe state.

Clause 11. The device according to clause 10, wherein the first driver circuit has a first terminal configured to receive a first switching signal, the first terminal being configured to connect to a first terminal of the controller; and wherein the first driver circuit is configured to drive the first switch based on the first switching signal on the first terminal of the first driver circuit when the first switch is not operating in the safe state.

Clause 12. The system according to any of clauses 9-11, wherein the control signal comprises an error signal.

Clause 13. The device according to any of clauses 9-12, further comprising a node between the output terminal of the second driver circuit and the control terminal of the first driver circuit; and wherein the node is configured to connect to the output terminal of the controller via a current limiting element such that if the second driver circuit drives the control signal to the first level, the control terminal of the first driver circuit is driven to the first level even if the controller drives the output terminal of the controller to a different level than the first level.

Clause 14. The device according to clause 13, wherein the first driver circuit is configured to drive the first switch based on the control signal on the output terminal of the first driver circuit when the first switch is not operating in the safe state.

Clause 15. The device according to any of clauses 13-14, wherein the second driver circuit is arranged to drive a control terminal of the second driver circuit to a first level if the second switch operates in the safe state, the control terminal of the second driver circuit being connected to an output terminal of the first driver circuit and being configured to connect to a second output terminal of the controller.

Clause 16. The device according to clause 15, wherein the second driver circuit is configured to drive the second switch based on a second control signal on the control terminal of the second driver circuit when the second switch is not operating in the safe state.

Clause 17. A method comprising: outputting, by a controller, a control signal at an output terminal of the controller to a first level or a second level, the output terminal of the controller being connected to a control terminal of a first driver circuit configured to drive a first switch and to an output terminal of a second driver circuit configured to drive a second switch; driving, by the second driver circuit, the output terminal of the second driver circuit to the first level to indicate an error related to the second driver circuit; and driving, by the first driver circuit, the first switch to operate in a safe state based on a determination that the control signal on the control terminal of the first driver circuit is at the first level.

Clause 18. The method according to clause 17, further comprising driving, by the controller, the output terminal of the controller to the first level to signal to the first driver circuit to drive the first switch to operate in the safe state.

Clause 19. The method according to clause 18, further comprising: outputting, by the controller, a first switching signal on a first terminal of the controller, the first terminal of the controller being connected to a first terminal of the first driver circuit; and driving, by the first driver circuit, the first switch based on the first switching signal on the first terminal of the first driver circuit when the first switch is not operating in the safe state.

Clause 20. The method according to any of clauses 17-19, wherein a node connects the output terminal of the second driver circuit and the control terminal of the first driver circuit; and wherein a current limiting element connects the output terminal of the controller and the node such that if the second driver circuit drives the control signal to the first level, the control terminal of the first driver circuit is driven to the first level even if the controller drives the output terminal of the controller to a different level than the first level.

In one or more examples, the functions being performed described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this way, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various aspects have been described in this disclosure. These and other aspects are within the scope of the following claims.

What is claimed is:

1. A system comprising:
    a first driver circuit configured to drive a first switch;
    a second driver circuit configured to drive a second switch;
    a controller arranged to control the first driver circuit and second driver circuit;
    wherein the controller has an output terminal configured to output a control signal to a first level or a second level,
    wherein a common interface is formed by an electrical connection of the output terminal of the controller to a control terminal of the first driver circuit and to an output terminal of the second driver circuit;
    wherein the second driver circuit is arranged to drive the output terminal of the second driver circuit to the first level to indicate an error related to the second driver circuit, wherein the common interface is configured to drive the control signal on the control terminal of the first driver to the first level when the second driver circuit drives the output terminal of the second driver circuit to the first level; and
    wherein the first driver circuit is arranged to drive the first switch to operate in a safe state based on a determination that the control signal on the control terminal of the first driver is at the first level.

2. The system according to claim 1, wherein the controller is arranged to drive the output terminal of the controller to the first level to signal to the first driver circuit to drive the first switch to operate in the safe state.

3. The system according to claim 2,
    wherein the controller has a first terminal configured to output a first switching signal, the first terminal of the controller being connected to a first terminal of the first driver circuit; and
    wherein the first driver circuit is configured to drive the first switch based on the first switching signal on the first terminal of the first driver circuit when the first switch is not operating in the safe state.

4. The system according to claim 1, wherein the control signal comprises an error signal.

5. The system according to claim 1, further comprising:
    a node between the output terminal of the second driver circuit and the control terminal of the first driver circuit; and
    a current limiting element between the output terminal of the controller and the node such that if the second driver circuit drives the control signal to the first level, the control terminal of the first driver circuit is driven to the first level even if the controller drives the output terminal of the controller to a different level than the first level.

6. The system according to claim 5, wherein the first driver circuit is configured to drive the first switch based on the control signal on the control terminal of the first driver circuit when the first switch is not operating in the safe state.

7. The system according to claim 5,
    wherein the controller further has a second output terminal configured to output a second control signal for the second switch to the first level or the second level, the second output terminal being connected to a control terminal of the second driver circuit and to an output terminal of the first driver circuit; and
    wherein the second driver circuit is arranged to drive the control terminal of the second driver circuit to the first level if the second switch operates in the safe state.

8. The system according to claim 7, wherein the second driver circuit is configured to drive the second switch based on the second control signal when the second switch is not operating in the safe state.

9. A device comprising:
a first driver circuit configured to drive a first switch;
a second driver circuit configured to drive a second switch;
wherein the second driver circuit is arranged to drive an output terminal of the second driver circuit to a first level to indicate an error related to the second driver circuit;
wherein a common interface is formed by an electrical connection of an output terminal of a controller arranged to control the first driver circuit and the second driver circuit to a control terminal of the first driver circuit and to the output terminal of the second driver circuit;
wherein the common interface is configured to drive a control signal on the control terminal of the first driver to the first level when the second driver circuit drives the output terminal of the second driver circuit to the first level; and
wherein the first driver circuit is arranged to drive the first switch to operate in a safe state based on a determination that the control signal on the control terminal of the first driver is at the first level.

10. The device according to claim 9, wherein the first driver circuit is arranged such that the controller drives the output terminal of the controller to the first level to signal to the first driver circuit to drive the first switch to operate in the safe state.

11. The device according to claim 10,
wherein the first driver circuit has a first terminal configured to receive a first switching signal, the first terminal being configured to connect to a first terminal of the controller; and
wherein the first driver circuit is configured to drive the first switch based on the first switching signal on the first terminal of the first driver circuit when the first switch is not operating in the safe state.

12. The device according to claim 9, wherein the control signal comprises an error signal.

13. The device according to claim 9,
further comprising a node between the output terminal of the second driver circuit and the control terminal of the first driver circuit; and
wherein the node is configured to connect to the output terminal of the controller via a current limiting element such that if the second driver circuit drives the control signal to the first level, the control terminal of the first driver circuit is driven to the first level even if the controller drives the output terminal of the controller to a different level than the first level.

14. The device according to claim 13, wherein the first driver circuit is configured to drive the first switch based on the control signal on the control terminal of the first driver circuit when the first switch is not operating in the safe state.

15. The device according to claim 13, wherein the second driver circuit is arranged to drive a control terminal of the second driver circuit to a first level if the second switch operates in the safe state, the control terminal of the second driver circuit being connected to an output terminal of the first driver circuit and being configured to connect to a second output terminal of the controller.

16. The device according to claim 15, wherein the second driver circuit is configured to drive the second switch based on a second control signal on the control terminal of the second driver circuit when the second switch is not operating in the safe state.

17. A method comprising:
outputting, by a controller, a control signal at an output terminal of the controller to a first level or a second level, wherein a common interface is formed by an electrical connection of the output terminal of the controller to a control terminal of a first driver circuit configured to drive a first switch and to an output terminal of a second driver circuit configured to drive a second switch;
driving, by the second driver circuit, the output terminal of the second driver circuit to the first level to indicate an error related to the second driver circuit, wherein the common interface is configured to drive the control signal on the control terminal of the first driver to the first level when the second driver circuit drives the output terminal of the second driver circuit to the first level; and
driving, by the first driver circuit, the first switch to operate in a safe state based on a determination that the control signal on the control terminal of the first driver circuit is at the first level.

18. The method according to claim 17, further comprising driving, by the controller, the output terminal of the controller to the first level to signal to the first driver circuit to drive the first switch to operate in the safe state.

19. The method according to claim 18, further comprising:
outputting, by the controller, a first switching signal on a first terminal of the controller, the first terminal of the controller being connected to a first terminal of the first driver circuit; and
driving, by the first driver circuit, the first switch based on the first switching signal on the first terminal of the first driver circuit when the first switch is not operating in the safe state.

20. The method according to claim 17,
wherein a node connects the output terminal of the second driver circuit and the control terminal of the first driver circuit; and
wherein a current limiting element connects the output terminal of the controller and the node such that if the second driver circuit drives the control signal to the first level, the control terminal of the first driver circuit is driven to the first level even if the controller drives the output terminal of the controller to a different level than the first level.

* * * * *